(12) United States Patent
Arndt

(10) Patent No.: US 8,018,213 B2
(45) Date of Patent: Sep. 13, 2011

(54) MEASURING THE CURRENT THROUGH A LOAD TRANSISTOR

(75) Inventor: Christian Arndt, Munich (DE)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 12/240,262

(22) Filed: Sep. 29, 2008

(65) Prior Publication Data

US 2010/0079120 A1    Apr. 1, 2010

(51) Int. Cl.
*G05F 1/40* (2006.01)
*G05F 1/44* (2006.01)

(52) U.S. Cl. ........ 323/269; 323/271; 323/272; 323/273; 323/274; 323/275

(58) Field of Classification Search .................. 323/269, 323/271, 272, 273, 274, 275
See application file for complete search history.

(56) References Cited

U.S. PATENT DOCUMENTS

| | | | |
|---|---|---|---|
| 5,867,014 A * | 2/1999 | Wrathall et al. | 323/316 |
| 6,011,413 A * | 1/2000 | Hayakawa et al. | 327/51 |
| 6,538,289 B1 * | 3/2003 | Topp et al. | 257/360 |
| 6,737,856 B2 * | 5/2004 | Sander | 324/158.1 |
| 7,009,403 B2 * | 3/2006 | Graf et al. | 324/522 |
| 7,126,354 B2 * | 10/2006 | Deboy et al. | 324/713 |
| 2002/0101225 A1 * | 8/2002 | Oyrer | 323/315 |
| 2008/0013229 A1 | 1/2008 | Alberkrack et al. | |
| 2010/0052635 A1 * | 3/2010 | Wang | 323/280 |

FOREIGN PATENT DOCUMENTS

| | | |
|---|---|---|
| DE | 10 2005 009 544 A1 | 9/2006 |
| DE | 10 2005 030 150 B3 | 12/2006 |
| WO | WO 2006/056232 A1 | 6/2006 |

OTHER PUBLICATIONS

"Smart Highside High Current Power Switch; Reversave," Data Sheet BTS650P, Oct. 2003, pp. 1-16, Infineon Technologies AG.
"Smart Highside Power Switch; PROFET ® BTS 6143 D," Data Sheet Rev. 1.0, 2007, pp. 1-18, Infineon Technologies AG.
"BTS5236-2GS; Smart High-side Power Switch; PROFET; Two Channels, 50 mΩ," 2007, pp. 1-27, Infineon Technologies AG.
"SPI Power Controller for Advanced Light Control," Product Brief, 2 pages, 2008, Infineon Technologies AG.

* cited by examiner

*Primary Examiner* — Bao Q Vu
(74) *Attorney, Agent, or Firm* — Slater & Matsil, L.L.P.

(57) ABSTRACT

The measurement of a current through a load transistor is described.

20 Claims, 5 Drawing Sheets

MEASURING THE CURRENT THROUGH A LOAD TRANSISTOR

TECHNICAL FIELD

Embodiments of the invention relate to transistor circuits.

BACKGROUND

In circuit arrangements which have a load transistor for switching or regulating a current flowing through a load, it may be necessary to measure a load current flowing through the load transistor. The current information thereby obtained may, for example, be used to regulate the current through the load or to switch off the load transistor to protect the latter against overload if the load current exceeds a predefined threshold value.

The "current-sense principle" can be applied to measure the load current through a load transistor. Here, a measuring transistor is provided which is connected in such a way that it is operated at least approximately at the same operating point, i.e., at the same control voltage, as the load transistor. A current flowing through the measuring transistor is then directly related to the load current and is evaluated to determine the load current. The ratio between the measuring current and the load current corresponds to the ratio between the total channel cross-section of the measuring transistor and the total channel cross-section of the load transistor or the ratio between the active transistor area of the measuring transistor and the active transistor area of the load transistor.

If the load transistor and the measuring transistor are not operated at exactly the same operating point, because, for example, an offset exists between the control voltage of the load transistor and the control voltage of the measuring transistor, the measuring current is not exactly proportional to the load current. However, a resulting measurement error is negligible if the flowing load current is so high that the control voltage of the load transistor is very much higher than the offset. Conversely, in the case of low load currents, there is a risk that the offset will lie in the region of the control voltage, so that a measurement error is no longer negligible.

SUMMARY

The present description relates to a circuit arrangement which has: an input to feed a control signal and an output to connect a load; a first load transistor with a control connection and a first and a second load path connection and a second load transistor with a control connection and a first and a second load path connection which are connected in parallel with one another, the control connections of which are connected to the input, and the second load path connections of which are connected to the output; a first measuring transistor with a control connection and a first and a second load path connection, the control connection of which is connected to the input and the first load path connection of which is connected to the first load path connections of the first and second load transistors; an evaluation circuit connected to the second load path connection of the measuring transistor, with a measuring output to provide a current-measuring signal; a first reverse-control circuit, which is connected to the control connection of the second load transistor and which is designed to regulate the second load transistor downwards if a voltage present between the first and the second load path connections of the first load transistor falls below a predefined limit value.

BRIEF DESCRIPTION OF THE FIGURES

Examples are explained below with reference to the figures. The focus is on the explanation of the basic principle. Thus, only the circuit components and signals required in order to understand this basic principle are presented in the figures. Unless otherwise indicated, in the figures, the same reference symbols designate the same parts with the same meaning.

FIG. 5, which includes

DETAILED DESCRIPTION OF THE DRAWINGS

Figure 1:
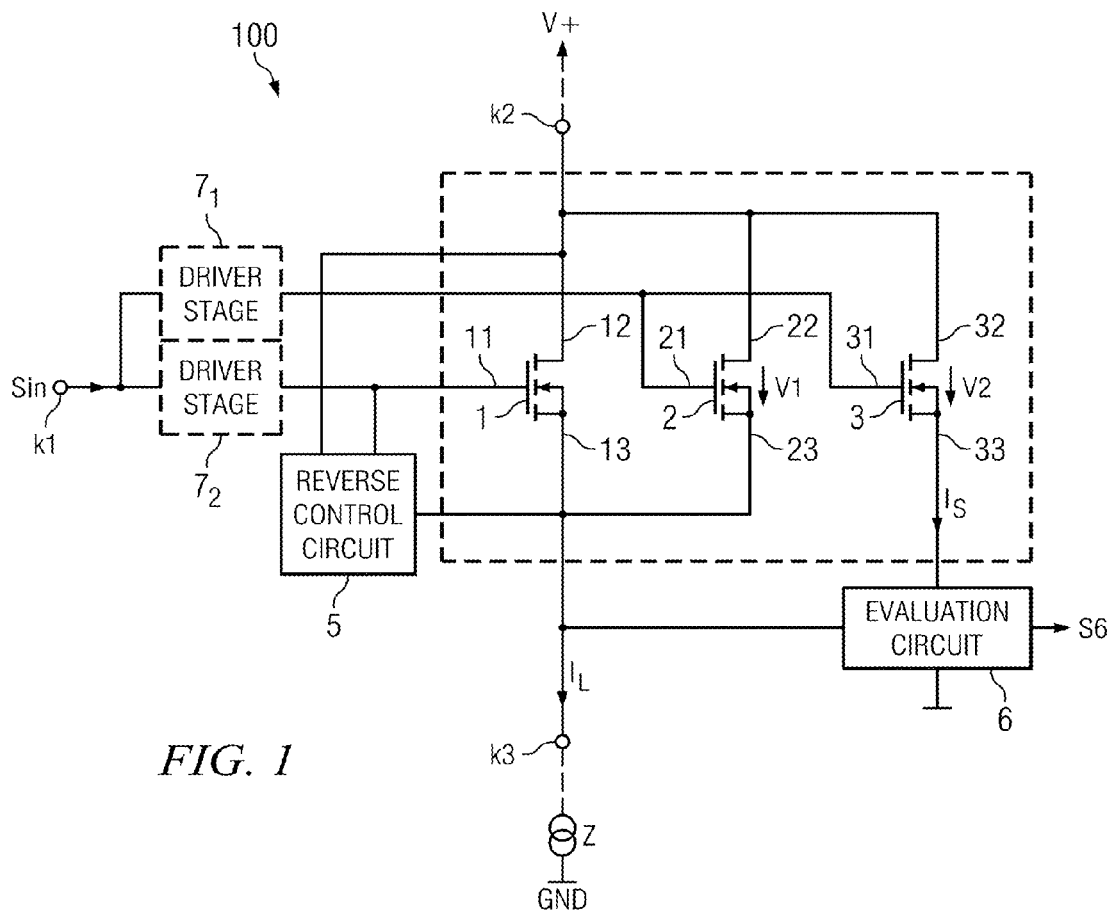
FIG. 1 illustrates a first example of a circuit arrangement which has two parallel-connected load transistors, a measuring transistor and an evaluation circuit.

FIG. 1 shows, with reference to an equivalent electrical circuit, a first example of a circuit arrangement for switching a load current $I_L$ flowing through a load Z and for measuring this load current $I_L$. This circuit arrangement has two load transistors 1, 2, each with a control connection 11, 21, a first load path connection 12, 22, a second load path connection 13, 23 and a load path 12-13, 22-23 running between the first and the second load path connections. These load transistors 1, 2 are connected in parallel in that their load paths 12-13, 22-23 are connected in parallel with one another between a first and a second connection terminal K2, K3. In the example shown, the first connection terminal K2 serves to apply a first supply potential V+ and the second connection terminal K3 serves in the example to connect the load Z. For clearer understanding, a load of this type Z is also shown in FIG. 1. When the circuit arrangement is operated, the termination of this load Z facing away from the second connection terminal K3 is connected to a terminal for a second supply potential GND.

In the example shown, the load transistors 1, 2 are connected as high-side switches. In this case, the load paths 12-13, 22-23 of the load transistors 1, 2 lie between a positive supply potential V+ and the load Z, the termination of which facing away from the load paths 11-12, 22-23 is connected to a negative supply potential or reference potential GND. The load Z can be any electrical load, in particular a resistive load, an inductive load or a capacitive load, which consumes a load current $I_L$ via the load paths of the load transistors 1, 2.

The load transistors 1, 2 conduct and block according to a control signal Sin which is fed to an input terminal K1 of the circuit arrangement. This control signal Sin can be made available in a manner not shown in more detail by a control circuit, e.g. a microcontroller. This control signal Sin can be fed directly to the control connections 11, 21 of the load transistors 1, 2. Optionally, a driver circuit 7 is provided which converts the control signal Sin to signal levels suitable for controlling the load transistors 11, 12. This driver circuit 7 may have a separate driver stage $7_1$, $7_2$ in each case for one of the load transistors 1, 2. The control signal Sin is fed to each of these driver stages $7_1$, $7_2$, which may be of identical design, and each of these driver stages $7_1$, $7_2$ provides an amplified control signal at its output to control the respective load transistor 1, 2. The provision of two separate driver stages $7_1$, $7_2$ effects a disconnection of the control connections 11, 21 of the two load transistors, which are nevertheless controlled in the same way depending on the control signal Sin.

Figure 2:
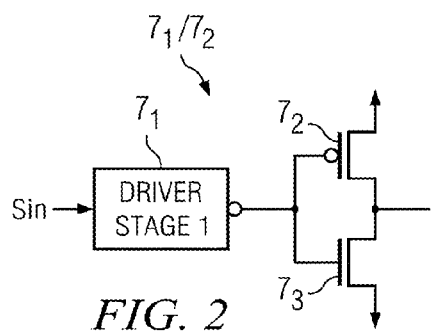
FIG. 2 illustrates an example of a driver circuit for controlling the transistors.

FIG. 2 shows an example of a driver stage $7_1$ or $7_2$ for controlling a load transistor. This driver circuit 7 comprises a half-bridge with two complementary transistors 72, 73, the load paths of which are connected in series with one another between terminals for a positive and a negative control potential. A circuit node common to the load paths of both transistors 72, 73 forms an output of the driver circuit which is connected to the control connection of the load transistor(s) to be controlled. The two transistors 72, 73 are controlled, conducting complementarily to one another, according to the control signal Sin. With the upper transistor 72 conducting, the control connection of the respective load transistor is connected to the positive control potential, and with the lower transistor 73 conducting, the control connection of the respective load transistor is connected to the negative control potential. In the example shown, the two transistors 72, 73 are controlled via an inverter. In this example, the upper 72 of the two transistors conducts when the level of the control signal Sin is high, and the lower 73 of the two transistors conducts when the level of the control signal Sin is low. The lower supply potential corresponds, for example, to the electrical potential on the second load path connections 13, 23, whereas the upper control potential lies above the potential on the second load path connections 13, 23.

The load transistors 1, 2 are controlled by the control signal Sin in a jointly conducting or blocking manner. A load current $I_L$, which flows through the parallel connection of the two load transistors 1, 2, corresponds to the current through the load Z. To measure this load current $I_L$, the circuit arrangement has a measuring transistor 3 which has a control connection 31 and a first and a second load path connection 32, 33. The control connection 31 of the measuring transistor 3 (FIG. 1) is connected to the input K1 and, in the example shown, is connected for this purpose to the control connection of one of the two load transistors, in the example to the control connection 21 of the second load transistor 2. One of the load path connections of the measuring transistor, in the example shown the first load path connection 32, is connected to the first load path connections 12, 22 of the two load transistors 1, 2. An evaluation circuit 6, which provides a current-measuring signal S6 which is dependent on a measuring current $I_S$ flowing through the load path 32-33 of the measuring transistor 3, is connected in series with the load path 32, 33 of the measuring transistor 3. The evaluation circuit 6 is designed to set the electrical potential on the second load path connection 33 at least approximately to the value of the electrical potential on the second load path connections 13, 23 of the load transistors 1, 2. The measuring transistor 3 is operated in this way at the same operating point as the second load transistor 2, to whose control connection 21 the control connection 31 of the measuring transistor 3 is connected, and to whose first load path connection 22 the first load path connection 33 of the measuring transistor 3 is connected.

To explain the mode of operation of the illustrated circuit arrangement, the ideal case will initially be assumed, wherein the two load transistors 1, 2 and the measuring transistor 3 are operated at the same operating point. In this case, the electrical potentials on the control connections 11, 21, 31 are in each case identical, the electrical potentials on the first load path connections 12, 22, 32 are in each case identical, and the electrical potentials on the second load path connections 13, 23, 33 are in each case identical. In this ideal case, the measuring current $I_S$ is directly proportional to the load current $I_L$. A proportionality factor $k_{ILIS}$ between the load current $I_L$ and the measuring current $I_S$ ($k_{ILIS}=I_L/I_S$) corresponds to the ratio between the sum of the active transistor areas a1, a2 of the load transistors 1, 2 and the active transistor area a3 of the measuring transistor 3. The following therefore applies:

$$k_{ILIS} = \frac{a1 + a2}{a3} \qquad (1)$$

The proportionality factor $k_{ILIS}$ is also referred to as the KILIS factor (from $k_{ILIS}$, where k represents the factor $I_L$ for the load current and $I_S$ represents the measuring current). The ratio between the sum of the active transistor areas of the first and second load transistors 1, 2 and the active transistor area of the measuring transistor 3 is, for example, between $10^2$:1 and $10^5$:1.

The load transistors 1, 2 and the measuring transistor 3 are in each case transistors of the same type. In the example shown, these transistors 1, 2, 3 are in each case self-blocking n-channel MOSFETs, which in each case have a gate connection as the control connection 11, 21, 31, a drain connection as the first load path connection 12, 22, 32, and a source connection as the second load path connection 13, 23, 33. It should be mentioned that the use of n-channel MOSFETs as transistors is to be understood merely as an example. Further transistors, such as, for example, p-channel MOSFETs, IGBTs or bipolar transistors, can of course be used instead of n-channel MOSFETs. MOSFETs, such as the n-channel MOSFETs shown, conduct and block depending on the electrical potentials on their gate connections 11, 21, 31 or the electrical voltages between their gate connections 11, 21, 31 and their source connections 13, 23, 33. The MOSFETs 1, 2, 3 are then operated at the same operating point, if their drain potentials, i.e. the electrical potentials on their drain connections 12, 22, 32 are identical and if their gate-source voltages are also identical.

In the case of a non-ideal circuit, a voltage offset may be present between the electrical potentials on the source connections 13, 23 of the load transistors 1, 2 on the one hand, and the source connection 33 of the measuring transistor 3 on the other hand. This voltage offset is caused, for example, by the evaluation circuit 6 and lies, for example, in the region of several mV. An offset of this type prevents the load transistors 1, 2 on the one hand and the measuring transistor 3 on the other hand from operating at exactly the same operating point.

The control voltage of a MOSFET is known to be directly related to the load current flowing through the MOSFET. In the case of high load currents $I_L$, the control voltages are correspondingly high and may lie in the region of several volts. For control voltages which are substantially higher than an existing voltage offset, it can be assumed that the load transistors 1, 2 on the one hand and the measuring transistor 3 on the other hand are operated at the same operating point. In this case, the measuring current $I_S$ is, in the manner explained, directly proportional to the load current $I_L$.

However, in the case of low load currents $I_L$, an existing voltage offset may have a negative impact on the measurement result. Cases in which the control voltage of the measuring transistor 3 is lower than the control voltage of the load transistors 1, 2 are particularly critical. In this case, the measuring current $I_S$ represents a load current which is lower than the actually flowing load current $I_L$.

Figure 3:
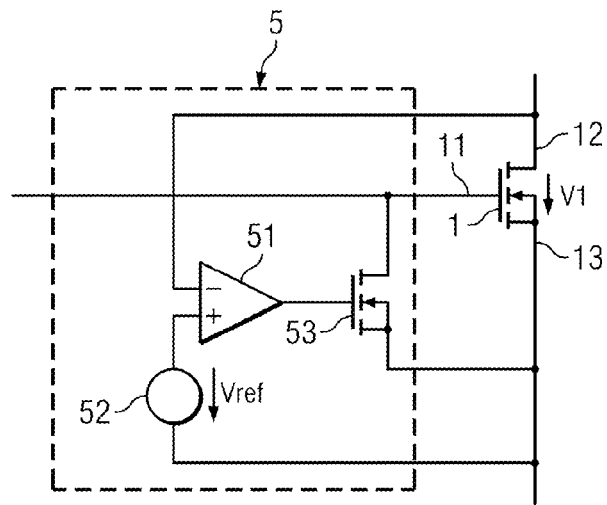
FIG. 3 illustrates an example of the reverse-control circuit.

In order to enable reliable current measurement even with low load currents, the circuit arrangement has a reverse-control circuit 5, which is connected to the control connection 11 of the first load transistor 1 and which is designed to reverse-control this load transistor 1 if a load path voltage V1 present over the load path 12, 13 of this load transistor 1 falls below a predefined threshold value. An example of such a reverse-control circuit 5 is shown in FIG. 3. The illustrated reverse-control circuit has a transistor 53 connected between the control connection 11 and the second load path connection 13 of the first load transistor 1, which is controlled by an operational amplifier 51 depending on a voltage difference between the load path voltage V1 and a reference voltage Vref provided by a reference voltage source 52. In the example shown, the inverting input of the operational amplifier 51 is for this purpose directly connected to the first load path connection 12, while its non-inverting input is connected via the reference voltage source 52 to the second load path connection 13 of the first load transistor. If the load path voltage V1 in this reverse-control circuit 5 is higher than the reference voltage Vref, the transistor 53 blocks. In this case, the control voltage 11 of the first load transistor 1 is defined solely by the control signal (Sin in FIG. 1) or by the control signal available on the optional driver circuit (7 in FIG. 1). As long as the load path voltage V1 is higher than the reference voltage Vref, the first load transistor 1 and the second load transistor (2 in FIG. 1) will operate at the same operating point. If the load current $I_L$ falls to such an extent that the load path voltage V1 attains the value of the reference voltage Vref or falls below this value, the transistor 53 is controlled upwards via the operational amplifier 51. The load transistor 1 is thereby regulated downwards, so that its closing resistance increases, counteracting a fall of the load path voltage V1 below the reference value Vref. The load path voltage is regulated in this manner to the reference value Vref.

Figure 4A:
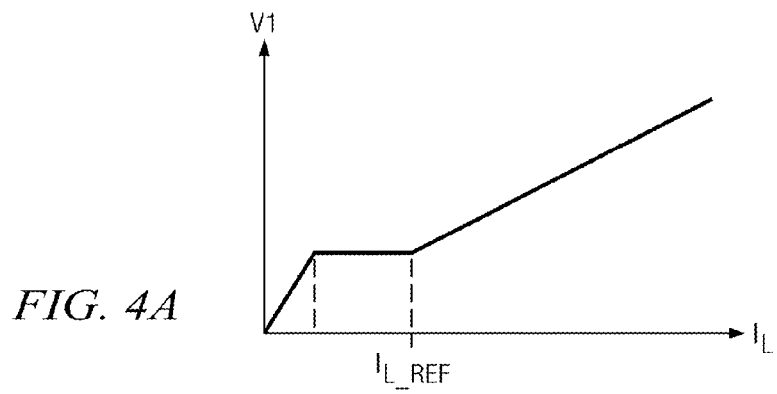
FIGS. 4A, 4B, and 4C, illustrates the mode of operation of the circuit arrangement presented in FIG. 1 with reference to signal patterns.
Figure 4B:
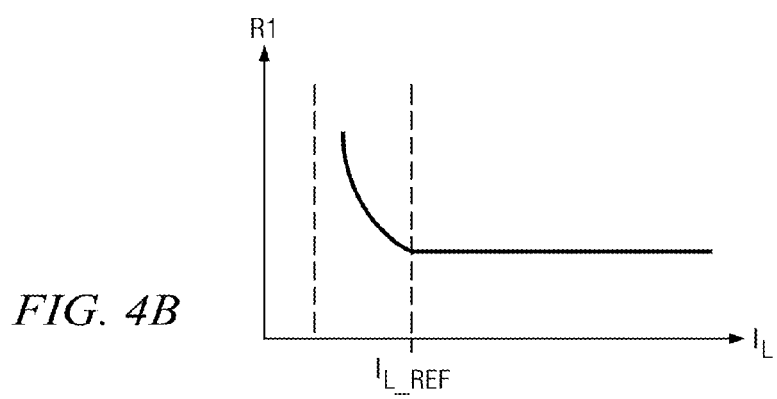
Figure 4C:
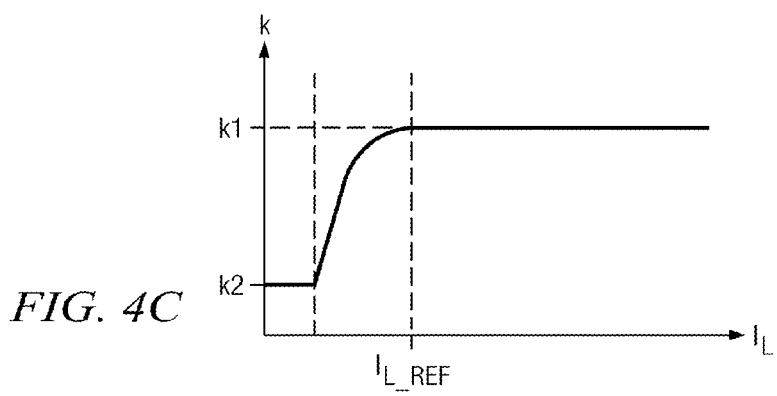
Figure 4D:
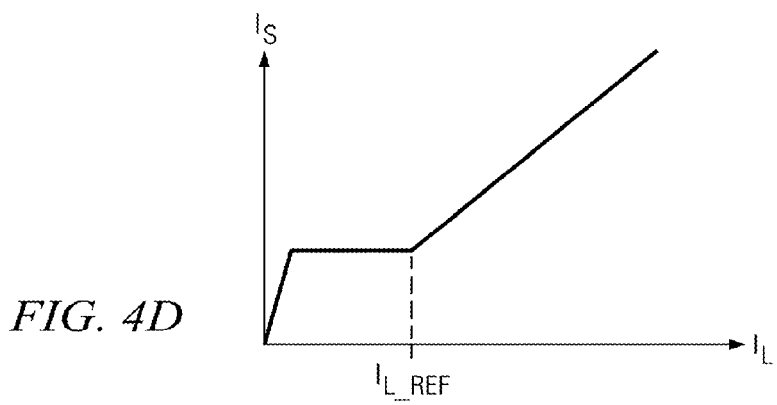
FIG. 4, which includes

FIG. 4A shows the pattern of the load path voltage V1 depending on the load current $I_L$. To explain this, a switching condition of the first load transistor will first be considered, in which the load path voltage V1 is higher than the reference voltage Vref and in which the first load transistor 1 is controlled in a completely conducting manner. A closing resistance R1, the pattern of which is shown in FIG. 4B depending on the load path voltage $I_L$, assumes a minimum value in this switching condition and is constant virtually independently from the flowing load current $I_L$. In this case, the load path voltage V1 is proportional to the flowing load current $I_L$.

If the load path voltage V1 falls to the reference value Vref, meaning that the load current $I_L$ has fallen to a load current reference value $I_{L\_REF}$, the first load transistor 1 is regulated downwards, whereby its closing resistance R1 is increased and the load path voltage V1 is also held on the reference value Vref for further falling load current values $I_L$. If the first load transistor 1 is regulated downwards to such an extent that its control voltage falls below the value of its inception voltage, the load current $I_L$ and the load path voltage V1 become zero.

By regulating the first load transistor 1 downwards in the case of low load currents $I_L$, or by increasing the closing resistance R1 of this first load transistor 1, the part of the load current $I_L$ flowing through the second load transistor 2 is increased until, for very low load currents $I_L$, in the case of which the first load transistor 1 is completely regulated downwards, the entire load current $I_L$ flows through the second load transistor 2. The load path voltage V1, which is also present over the second load transistor 2, and the control voltage of the second load transistor 2 are increased if the first load transistor 1 is regulated downwards. Any existing offset between the control voltage of the second load transistor 2 and the measuring transistor 3 will thereby affect the measurement result to a smaller extent. This reference value is selected in particular so that it is high in comparison with possible offset voltages between the second load path potentials of the measuring transistors 3, 4 on the one hand and the load transistors 1, 2 on the other hand.

However, with the downward regulation of the first load transistor 1, the proportionality factor between the load current $I_L$ and the measuring current $I_S$ changes. If both load transistors 1, 2 are controlled in a completely conducting manner, this proportionality factor corresponds in the manner explained to the ratio between the sum of the active transistor areas of the first and second load transistors 1, 2 and the active transistor area of the measuring transistor 3. In the case of complete downward regulation of the first load transistor 1, this proportionality factor corresponds to the ratio between the active transistor area of the second load transistor 2 and the active transistor area of the measuring transistor 3. In this case, the following therefore applies:

$$k_{ILIS} = \frac{a2}{a3} \tag{2}$$

The second load transistor 2 and the measuring transistor 3 are, for example, tuned to one another in such a way that this area ratio is between 10:1 and 1:1. In this case, the measuring current $I_S$ is between 10% and 100% of the load current $I_L$. For load currents $I_L$ which are lower than the load current reference value $I_{L\_REF}$, the measuring current $I_S$ is constant, since, for these low load currents, the control voltage of the measuring transistor 3 is held at a constant value corresponding to the load path voltage V1 of the first and the second transistors.

Figure 5A:
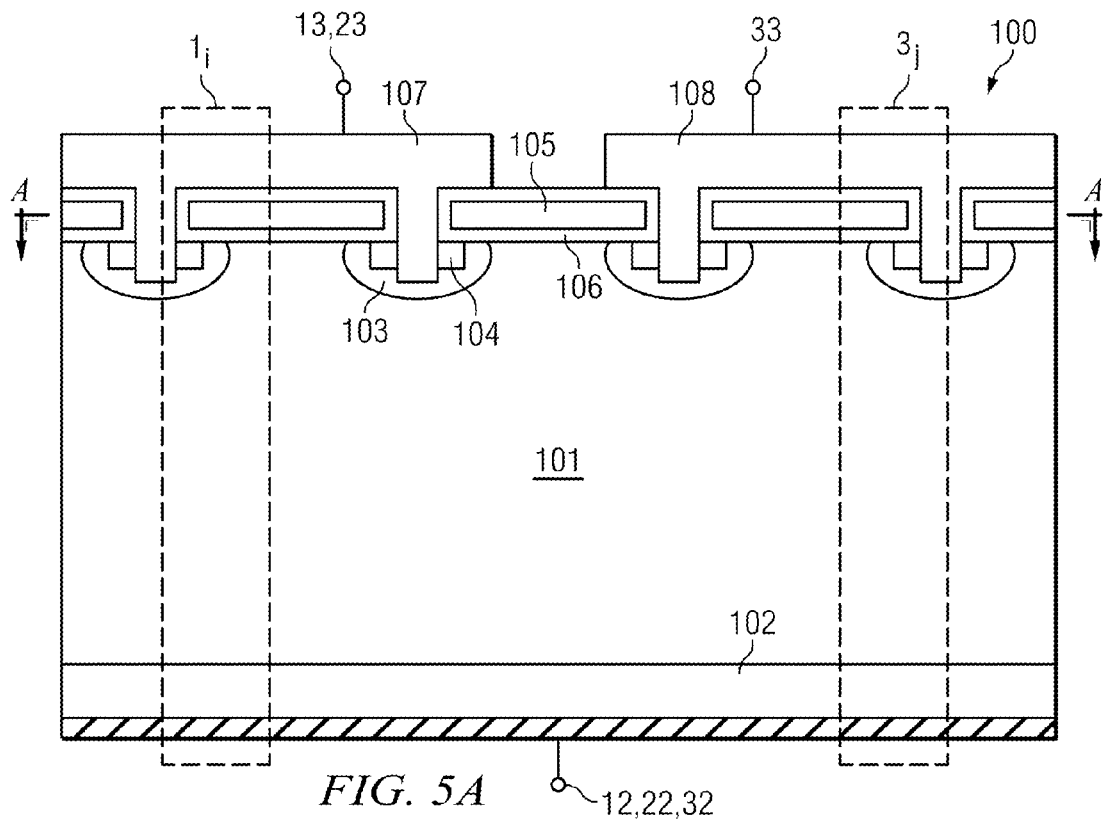
FIGS. 5A and 5B, illustrates an integration of the load transistors and the measuring transistor in a common semiconductor body with reference to a vertical and a horizontal cross-section through a semiconductor body.

In one example, it is provided for the two load transistors 1, 2 and the measuring transistor 3 to be integrated in a common semiconductor body. FIG. 5A shows a vertical cross-section through a semiconductor body 100 of this type, in which these transistors are commonly integrated. In the example shown, these transistors are implemented as vertical MOSFETs. For this purpose, the semiconductor body 100 has a first semiconductor layer 102, which forms a common drain zone of the load transistors and the measuring transistor and which is contacted by a connection electrode which forms the drain connections 12, 22, 32 of these transistors. A more lightly doped second semiconductor layer 101 which forms a common drift zone of the load transistors 1, 2 and the measuring transistor, is connected in the vertical direction to this first semiconductor layer 102. In this drift zone, a cell field with a plurality of transistor cells with an identical structure is implemented, which in each case have a body zone 103 and a source zone 104 doped complementarily to the body zone 103. The body zone 103 of a transistor cell is disposed here between the source zone 104 of this transistor cell and the drift zone 101. To control a conducting channel between the source zones 104 and the drift zone 101, a gate electrode 105 is provided, which is isolated from the semiconductor body by a gate dielectric 106 and which is disposed adjacent to the body zone 103. In the example shown, the gate electrode 105 is a planar electrode which is disposed above one side of the semiconductor body 100. In this context, it should be noted that the transistor cell geometry shown in FIG. 5A is to be understood merely as an example and that transistor cells with any other given transistor cell geometries can of course also be used, such as, for example, trench transistor cells.

The transistor cell field is subdivided into three partial cell fields: a first partial cell field, which forms the first load transistor; a second partial cell field, which forms the second load transistor; and a third partial cell field, which forms the measuring transistor. The source zones of the transistor cells of the first and second cell fields are contacted by a first source electrode 107, which forms the common source connection 13, 23 of the two load transistors 1, 2. The transistor cells of the third cell field are contacted by a second source electrode 108, which forms the source connection 33 of the measuring transistor. In FIG. 5A, $1_i$ denotes a transistor cell of one of the first or second partial cell fields, and $3_j$ denotes a transistor cell of the third partial cell field. In order to prevent the second load transistor 2 from also being regulated downwards when the first load transistor 1 is regulated downwards by the reverse-control circuit 5, the first and second load transistors 1, 2 have separate gate electrodes.

Figure 5B:
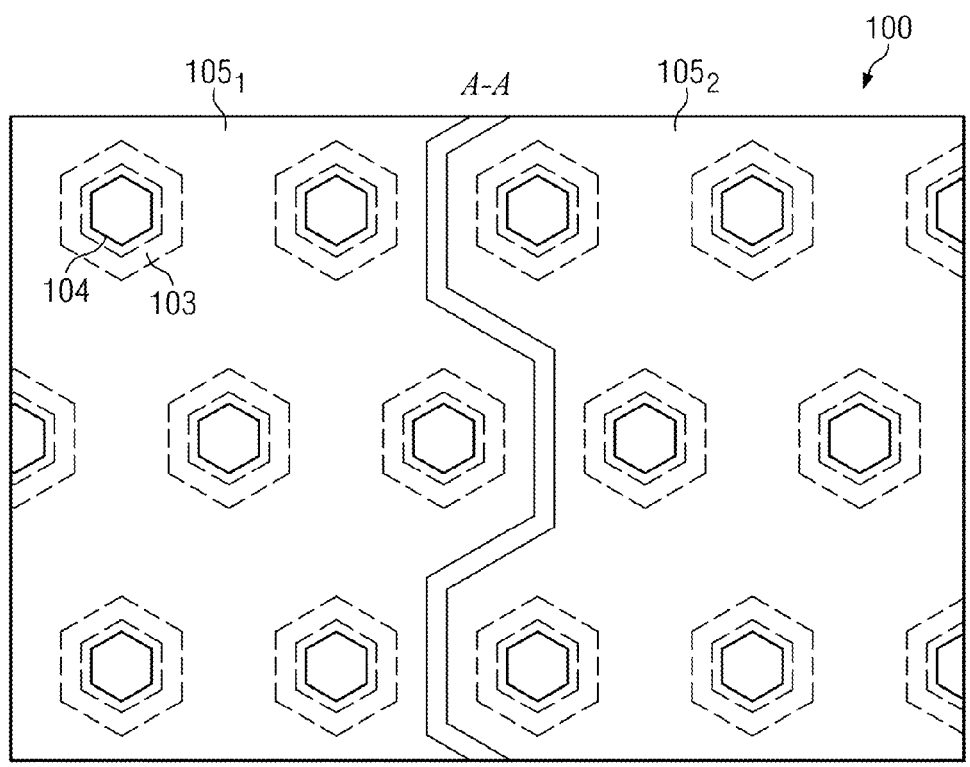

FIG. 5B shows a horizontal cross-section in a section plane A-A shown in FIG. 5A in the area of the first and second partial cell fields. As shown in FIG. 5B, the gate electrode 105 has two gate electrode sections: a first gate electrode section $105_1$, for the transistor cells of the first cell field, i.e. the transistor cells of the load transistor 1; and a second gate electrode section $105_2$, which is separated from the first gate electrode section $105_1$, for the transistor cells of the second and third cell fields, i.e. for the transistor cells of the second load transistor 2 and the measuring transistor 3. In the example shown in FIG. 5B, the transistor cells are hexagonal cells, but may of course have any other given cell geometries, such as, for example, a stripe geometry.

In one example, it is provided for the transistor cells of the individual partial cell fields to be implemented in such a way that, in each case, they have the same channel cross-section. The channel cross-section of one of the load transistors and the measuring transistor is then directly proportional to the number of transistor cells of the respective transistor. In this case, the following applies to the amplification factor $k_{ILS}$ if the first load transistor is controlled in a completely conducting manner:

$$k_{ILS} = \frac{(n1 + n2)}{n3} \quad (3a)$$

where n1 designates the number of transistor cells of the first load transistor 1, n2 designates the number of transistor cells of the second load transistor 2, and n3 designates the number of transistor cells of the measuring transistor. If the first load transistor 1 is completely regulated downwards, the following applies accordingly to the amplification factor $k_{ILS}$:

$$k_{ILS} = \frac{n2}{n3}. \quad (3b)$$

Figure 6:
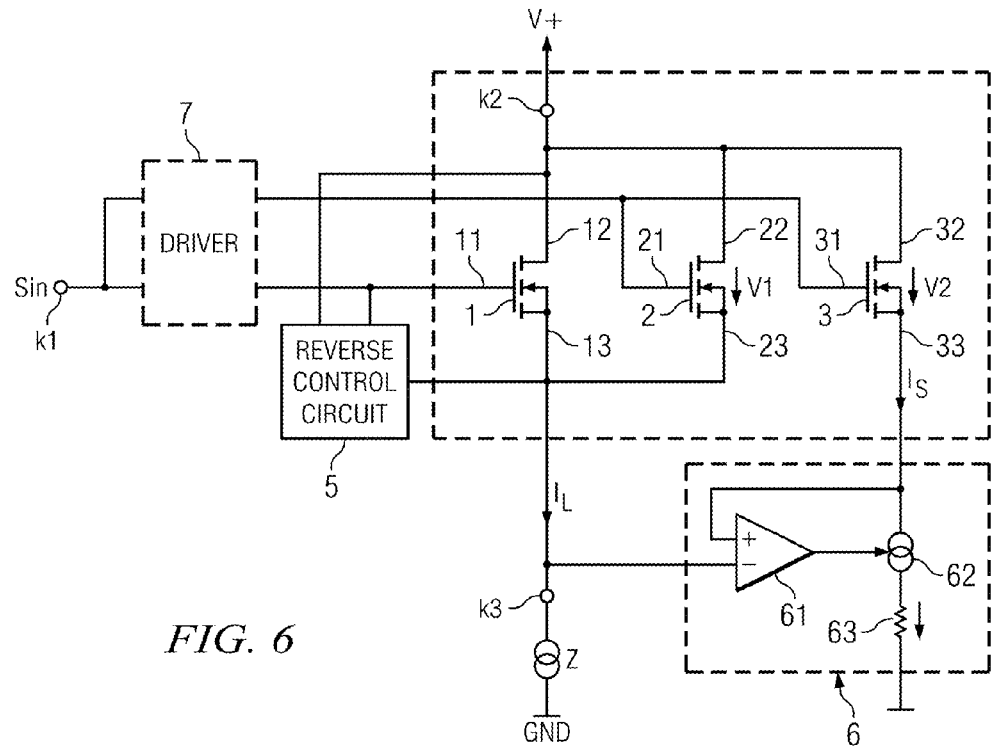
FIG. 6 illustrates an example of the evaluation circuit.

FIG. 6 illustrates, with reference to an equivalent electrical circuit, an example embodiment of the evaluation circuit 6 connected in series with the load path of the measuring transistor 3. This evaluation circuit 6 has a control circuit 61, 62, which serves to set the electrical potential on the second load path connection 33 of the measuring transistor 3 to the value of the electrical potential on the second load path connections 13, 23 of the load transistors 1, 2. In the example shown, this control circuit 61, 62 has a control amplifier 61, such as, for example, an operational amplifier, with a first input, in the example the non-inverting input, which is connected to the second load path connection 33 of the measuring transistor 3, and with a second input, in the example the inverting input, which is connected to the second load path connections 13, 23. An output of the control amplifier 61 controls a load 62 connected in series with the load path 32-33 of the measuring transistor 3. In the example shown, this load 62 is a current source, which can be implemented, for example, as a transistor. In this control circuit 61, 62, the current consumption of the load 62 is controlled in such a way that a voltage difference on the inputs of the control amplifier 61 and therefore a voltage difference between the second load path connections of the measuring transistor 3 on the one hand and the load transistors 1, 2 on the other hand is zero. A previously explained yet present offset between these load path voltages may be present if the control amplifier 61 has a voltage offset between its input terminals. In series with the load 62, the evaluation circuit 6 has a current-measuring resistor 63, over which a voltage is present depending on the measuring current $I_S$, which forms the current-measuring signal S5. This current-measuring signal S5 is directly proportional to the measuring current $I_S$, whereby the proportionality factor is the resistance of the ohmic resistor 63.

Figure 7:
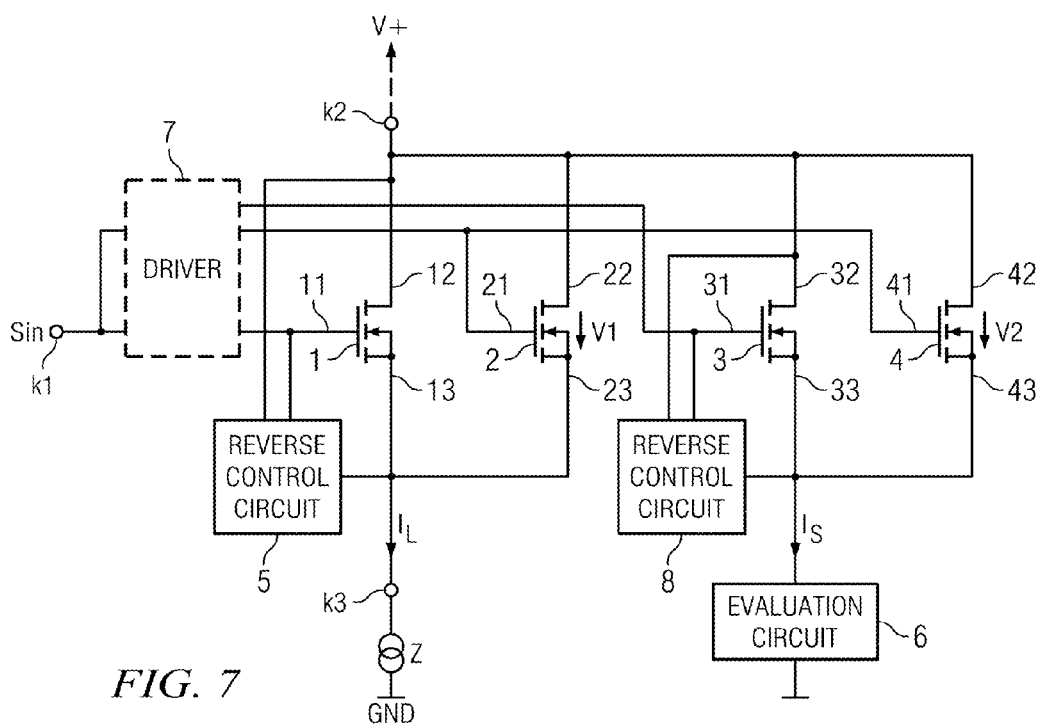
FIG. 7 shows an example of a circuit arrangement which has two load transistors, two measuring transistors and a reverse-control circuit for one of the measuring transistors.

FIG. 7 illustrates, with reference to an equivalent electrical circuit, a further example of a circuit arrangement. This circuit arrangement differs from the circuit arrangement explained with reference to FIG. 1 in that two measuring transistors are provided: a first measuring transistor 3 with a control connection 31 and a first and a second load path connection 32, 33; and a second measuring transistor 4 with a control connection 41 and a first and second load path connection 42, 43. These two measuring transistors 3, 4 are connected in parallel in that their load paths are connected in parallel with one another. Corresponding to the example embodiment shown in FIG. 1, in which only one measuring transistor is present, the two measuring transistors 3, 4 in the example embodiment shown in FIG. 7 are controlled depending on the control signal Sin. This circuit arrangement has a second reverse-control circuit 8, which is connected to the control connection 31 of the first measuring transistor 3 and is designed to regulate this measuring transistor 3 downwards depending on the load path voltage V1 of the first measuring transistor 3. This reverse-control circuit 8 can be implemented corresponding to the reverse-control circuit shown in FIG. 3. In a manner not shown in more detail, it is also possible to feed the load path voltage V1 of the first and second load transistors 1, 2 instead of the load path voltage V2 of the first measuring transistor 3 to the reverse-control circuit. In this case, the first measuring transistor 3 is reverse-controlled depending on the load path voltage V1 of the first and second load transistors 1, 2 and, in order to disconnect the control connection 31 of the first measuring transistor 3 from the control connection 41 of the second measuring transistor 4, the optionally provided driver circuit 7 can be designed to generate three control signals depending on the input signal Sin: a first control signal for the first load transistor 1; a second control signal for the second load transistor 2 and the second measuring transistor 4; and a third control signal for the first measuring transistor 3. For this purpose, the driver circuit has, for example, three driver stages, as explained with reference to FIG. 2.

These control signals generated by the driver circuit 7 depending on the input signal Sin are identical. A different control of the transistors only occurs if the load current $I_L$ has decreased to such an extent that the first load transistor 1 and the first measuring transistor 3 are reverse-controlled by the reverse-control circuits 5, 8. The threshold values or reference values at which the reverse-control circuits 5, 8 reverse-control the first load transistor 1 and the first measuring transistor 3 are at least approximately identical. If the load current $I_L$ decreases in the manner explained to such an extent that the first load transistor 1 and the first measuring transistor 3 are reverse-controlled, the proportion of the load current $I_L$ through the second load transistor 2 and the proportion of the measuring current $I_S$ through the second measuring transistor 4 will increase. The load path voltages V1, V2 over the second load transistor 2 and the second measuring transistor 4 are thereby held constant at the reference value. This reference value is selected in such a way that it is high in comparison with possible offset voltages between the second load path potentials of the measuring transistors 3, 4 on the one hand and the load transistors 1, 2 on the other hand. The simultaneous reverse-control of the first load transistor 1 and the first measuring transistor 3 enables the current amplification factor $k_{ILIS}$, in contrast to the example embodiment explained with reference to FIG. 4, to be held constant with decreasing load currents $I_L$. In this case, the load transistors 1, 2 and the measuring transistors 3, 4 are selected in such a way that a ratio between the active transistor areas of the first and second load transistors 1, 2 corresponds to a ratio between the active transistor areas of the first and second measuring transistors 3, 4.

$$\frac{a1}{a2} = \frac{a3}{a4} \quad (4)$$

where a1 and a2 designate the active transistor areas of the first and second load transistors 1, 2, and a3 and a4 designate the active transistor areas of the first and second measuring transistors 3, 4. If these transistors are designed with a cellular structure, in each case with a number of transistor cells, the following applies:

$$\frac{n1}{n2} = \frac{n3}{n4} \quad (5)$$

where n1 and n2 designate the number of transistor cells of the first and second load transistors 1, 2, and n3 and n4 designate the number of transistor cells of the first and second measuring transistors 3, 4. The ratio between the sum of the active transistor areas of the first and second load transistors and the sum of the active transistor areas of the first and second measuring transistors is, for example, between $10^2:1$ and $10^5:1$.

Figure 8:
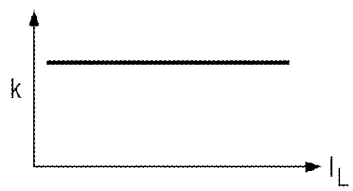
FIG. 8 illustrates the mode of operation of the circuit arrangement shown in FIG. 7 with reference to a signal pattern.

FIG. 8 illustrates the current amplification factor k depending on the load current $I_L$ for the circuit arrangement according to FIG. 7. In this example, the load current k remains constant, even for low load currents $I_L$. The current amplification factor k is no more defined, only being defined for load current values $I_L$ which are so low that the associated control voltage lies in the region of the inception voltage of the respective transistor.

Figure 9:
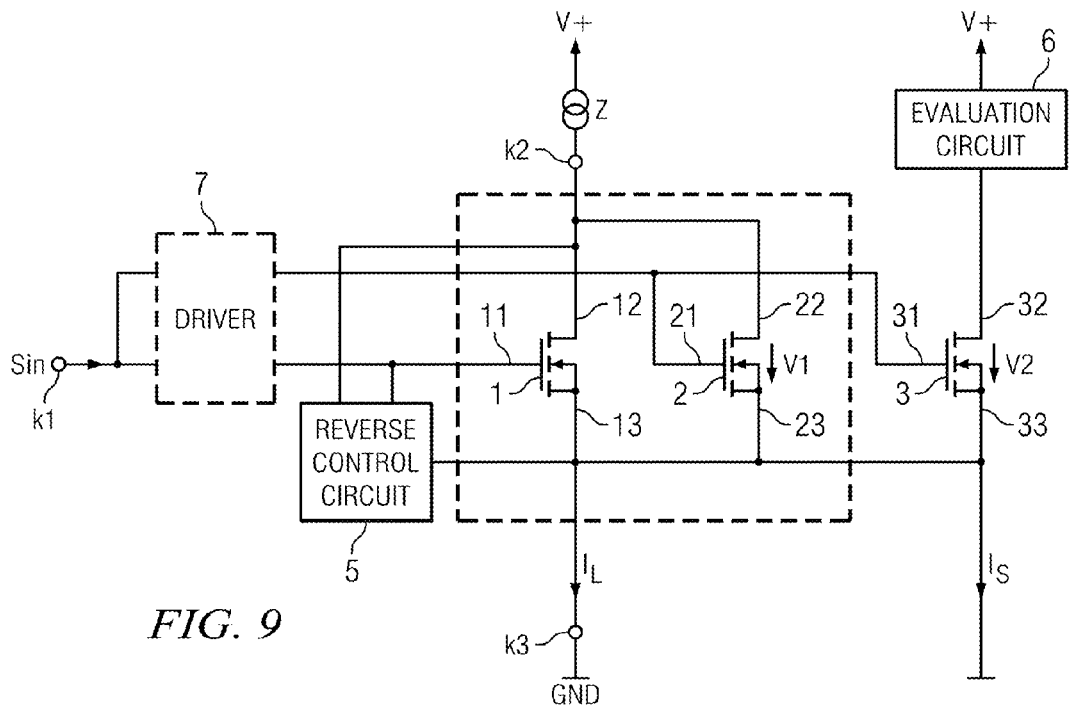
FIG. 9 shows a further example of a circuit arrangement with two load transistors and a measuring transistor.

In the circuit arrangements previously explained, the load transistors 1, 2—and correspondingly the measuring transistor 3 or the measuring transistors 3, 4—are connected as high-side switches. The basic principle of the previously explained circuit arrangement, i.e. the reverse-control of at least one of the load transistors for low load currents $I_L$, of course also applies in a corresponding manner to circuit arrangements in which the load transistors are connected as low-side switches. FIG. 9 shows a circuit arrangement of this type. In this circuit arrangement, the load Z is connected between the terminal for the positive supply potential V+ and the first connection terminal K2 of the circuit arrangement. The second load path connections 13, 23, 33 of the load transistors 1, 2 and the measuring transistor 3 are short-circuited in this circuit arrangement. Furthermore, the first load path connections 12, 22 of the load transistors 1, 2 are short-circuited and connected to the first connection terminal K2. An adjustment of the operating point of the measuring transistor 3 to the same operating points as the first and second load transistors 1, 2 is carried out in this circuit arrangement by adjusting the electrical potential on the first load path connection 32 of the measuring transistor 3. For this purpose, the evaluation circuit 6 is connected between the terminal for the positive supply potential V+ and this first load path connection 32. Otherwise, the circuit arrangement shown in FIG. 9 functions according to the circuit arrangement shown with reference to FIG. 1. The circuit arrangement shown in FIG. 9 can of course also be modified according to the circuit arrangement shown in FIG. 7 in such a way that, instead of only one measuring transistor 3, two measuring transistors are provided, one of which can be reverse-controlled by means of a reverse-control circuit.

Figure 10:
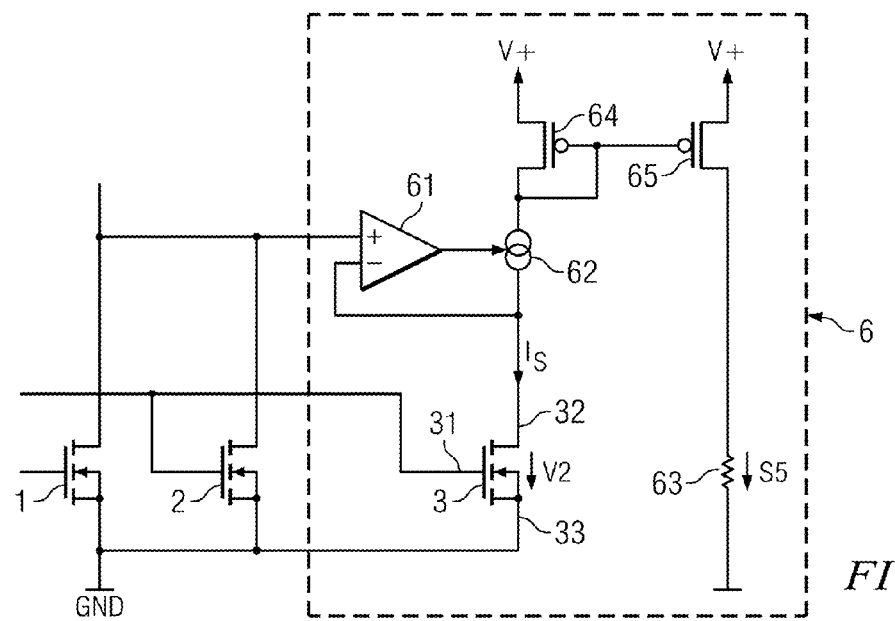
FIG. 10 shows an example of an evaluation circuit for the circuit arrangement shown in FIG. 9.

An example of an evaluation circuit 6 for the circuit arrangement shown in FIG. 9 is shown in FIG. 10. Corresponding to the evaluation circuit explained with reference to FIG. 6, this evaluation circuit 6 has a control amplifier 61, to which the first load path potential of the first and second load transistors and the first load path potential of the measuring transistor 3 are fed, and which controls a load 62 connected in series with the load path 32, 33 of the measuring transistor 3. The evaluation circuit 6 furthermore has a measuring transistor 63, at which the current-measuring signal S5 can be tapped as a voltage. However, in contrast to the example shown in FIG. 6, this measuring transistor is not connected in series with the load path 32, 33 of the measuring transistor 3, but is connected to a current minor 64, 65, which minors the measuring current $I_S$ flowing through into the measuring transistor 3 onto a current branch containing the measuring transistor 3. The current flowing through the measuring transistor 63 is related here to the measuring current $I_S$ via the current mirror ratio of the current minor 64, 65. This current minor ratio is, for example, 1:1. In this case, the current flowing through the measuring transistor 63 corresponds to the measuring current $I_S$. The provision of the current mirror 64, 65 to map the measuring current $I_S$ onto the measuring transistor 63 enables the current-measuring signal S5 to be output as a voltage which is referred to reference potential GND.

In conclusion, it should be mentioned that method or circuit features which have been explained only in the context of an example can be combined with method or circuit features from other examples, even if this has not previously been explicitly explained. Thus, in particular, features which are described in one of the claims below can be combined with features of any other claims.

The invention claimed is:

1. A circuit arrangement comprising:
   an input to feed a control signal and an output to couple a load;
   a first load transistor having a control connection and a first and a second load path connection and a second load transistor having a control connection and a first and a second load path connection coupled in parallel with one another, wherein the control connections are coupled to the input, and the second load path connections are coupled to the output;
   a first measuring transistor having a control connection and a first and a second load path connection, wherein the control connection is coupled to the input and the first load path connection is coupled to the first load path connections of the first and second load transistors;
   an evaluation circuit coupled to the second load path connection of the measuring transistor, the evaluation circuit comprising a measuring output to provide a current-measuring signal;
   a first reverse-control circuit coupled to the control connection of the second load transistor, the first reverse-control circuit designed to regulate the second load transistor downwards if a voltage between the first and the second load path connections of the first load transistor falls below a predefined limit value.

2. The circuit arrangement according to claim 1, wherein the first load transistor has a first number of transistor cells coupled in parallel with one another, the second load transistor has a second number of transistor cells coupled in parallel with one another and the measuring transistor has a third number of transistor cells coupled in parallel with one another.

3. The circuit arrangement according to claim 2, wherein a sum of the first and the second numbers is greater than the third number.

4. The circuit arrangement according to claim 3, wherein a ratio between the sum of the first and second numbers and the third number is between $10^2:1$ and $10^5:1$.

5. The circuit arrangement according to claim 3, wherein a ratio between the first number and third number is between 10:1 and 1:1.

6. The circuit arrangement according to claim 1, wherein the first and the second load transistors and the measuring transistor are integrated in a common semiconductor body.

7. The circuit arrangement according to claim 2, further comprising:
   a second measuring transistor having a control connection and a first and a second load path connection, wherein the second measuring transistor is coupled in parallel with the first measuring transistor and the control connection of the second transistor is connected to the input;
   a second reverse-control circuit coupled to the control connection of the first measuring transistor, the second reverse-control circuit designed to regulate the first measuring transistor downwards if the voltage between the first and the second load path connections of the first load transistor falls below the predefined limit value, or if a voltage between the first and the second load path connections of the first measuring transistor falls below the predefined limit value.

8. The circuit arrangement according to claim 7, wherein the second measuring transistor has a fourth number of transistor cells connected in parallel, wherein a ratio between the fourth number and the third number corresponds to a ratio between the second number and the first number.

9. The circuit arrangement according to claim 7, wherein the first and second load transistors and the first and second measuring transistors are integrated in a common semiconductor body.

10. The circuit arrangement according to claim 1, in which wherein the evaluation circuit comprises:
    a control circuit coupled to the second load path connections of the first and second load transistors and the first measuring transistor, and which wherein the control circuit is designed to set an electrical potential on the second load path connection of the measuring transistor at least approximately to the value of the electrical potential on the second load path connections of the first and second load transistors.

11. The circuit arrangement according to claim 1, wherein the evaluation circuit comprises:
    a measuring resistor coupled to the second load path connection of the measuring transistor.

12. The circuit arrangement according to claim 1, further comprising a load coupled to the second load path connections of the first and second driving transistors.

13. A semiconductor circuit comprising:
    a first driving transistor comprising a control node, a first load path node, and a second load path node;
    a second driving transistor comprising a control node, a first load path node coupled to the first load path node of the first driving transistor, and a second load path node coupled to the second load path node of the first driving transistor;
    a first current measuring transistor comprising a control node coupled to the control node of the second driving transistor; and
    a first control circuit coupled to the control node and second load path node of the first driving transistor, the first control circuit configured to decrease a current flowing through the first driving transistor if a voltage between the first load path node of the first driving transistor and the second load path node of the first driving transistor is below a predetermined limit.

14. The semiconductor circuit of claim 13, wherein:
    the first driving transistor, the second driving transistor and the first current measuring transistor comprise MOS devices;
    the control nodes of the first driving transistor, the second driving transistor and the first current measuring transistor comprise gates;
    the first load path nodes of the first driving transistor, the second driving transistor and the first current measuring transistor comprise drains; and
    the first load path nodes of the first driving transistor, the second driving transistor and the first current measuring transistor comprise sources.

15. The semiconductor circuit of claim 13, further comprising a current measuring circuit coupled in series with the first current measuring transistor.

16. The semiconductor circuit of claim 13, further comprising:
    a second current measuring transistor comprising
       a first load path node coupled to the first load path node of the first current measuring transistor, and
       a second load path node coupled to the second load path node of the first current measuring transistor; and
    a second control circuit coupled to the control node and second load path node of the first measuring transistor, the second control circuit configured to decrease a current flowing through the first measuring transistor if a voltage between the first load path node of the first measuring transistor and the second load path node of the first measuring transistor is below a predetermined limit.

17. The semiconductor circuit of claim 13, wherein the control circuit comprises:
   a control transistor comprising a first load path node coupled to the control node of the first driving transistor and a second load path node coupled to the second load path node of the first driving transistor;
   an amplifier comprising an output coupled to a control node of the control transistor, and an inverting input coupled to the first load path node of the first driving transistor, and an non-inverting input; and
   a reference voltage coupled between the non-inverting input of the amplifier and the second load path node of the first driving transistor.

18. The semiconductor circuit of claim 17, further comprising:
   a second current measuring transistor comprising
      a first load path node coupled to the first load path node of the first current measuring transistor, and
      a second load path node coupled to the second load path node of the first current measuring transistor;
   a second control circuit coupled to the control node and second load path node of the first measuring transistor, the second control circuit configured to decrease a current flowing through the first measuring transistor if a voltage between the first load path node of the first measuring transistor and the second load path node of the first measuring transistor is below a predetermined limit;
   a current measuring circuit coupled in series with the first and second current measuring transistors.

19. A method of measuring a current flowing though a driving circuit, the method comprising:
   biasing a current measuring transistor control node, a current measuring transistor first load path node, and a current measuring transistor second load path node at an operating point substantially similar to a control node, a first load path node, and a second load path node of a second driving transistor;
   biasing a first driving transistor first load path node, and a first driving transistor second load path node at an operating point substantially similar to the first load path node, and the second load path node of the second driving transistor;
   biasing a driving transistor control node at an operating point substantially similar to the control node of the second driving transistor if a voltage between the first driving transistor first load path node and the first driving transistor second load path node is not less than a set threshold; and
   reducing a voltage between the driving transistor control node and the driving transistor second load path node if the voltage between the first driving transistor first load path node and the first driving transistor second load path node is not less than the set threshold.

20. The method of claim 19, wherein biasing the current measuring transistor second load path node comprises setting the current measuring transistor second load path node to a voltage of the first driving transistor second load path node using a feedback loop.

* * * * *

UNITED STATES PATENT AND TRADEMARK OFFICE
CERTIFICATE OF CORRECTION

PATENT NO.        : 8,018,213 B2
APPLICATION NO.   : 12/240262
DATED             : September 13, 2011
INVENTOR(S)       : Arndt Page 1 of 1

It is certified that error appears in the above-identified patent and that said Letters Patent is hereby corrected as shown below:

In Col. 12, line 5, claim 10, delete "in which".
In Col. 12, line 9, claim 10, delete "and which".

Signed and Sealed this
Third Day of April, 2012

David J. Kappos
*Director of the United States Patent and Trademark Office*